(12) United States Patent
Jang et al.

(10) Patent No.: US 10,379,786 B2
(45) Date of Patent: Aug. 13, 2019

(54) SEMICONDUCTOR DEVICES

(71) Applicant: SK hynix Inc., Icheon-si Gyeonggi-do (KR)

(72) Inventors: Mun Seon Jang, Seoul (KR); Saeng Hwan Kim, Suwon-si Gyeonggi-do (KR); Chang Ki Baek, Anyang-si Gyeonggi-do (KR); Jae Woong Yun, Seoul (KR)

(73) Assignee: SK hynix Inc., Icheon si Gyeonggi-do (KR)

( * ) Notice: Subject to any disclaimer, the term of this patent is extended or adjusted under 35 U.S.C. 154(b) by 224 days.

(21) Appl. No.: 15/257,995

(22) Filed: Sep. 7, 2016

(65) Prior Publication Data
US 2017/0337105 A1   Nov. 23, 2017

(30) Foreign Application Priority Data
May 18, 2016   (KR) .................. 10-2016-0061101

(51) Int. Cl.
| | |
|---|---|
| *G11C 29/00* | (2006.01) |
| *G06F 3/06* | (2006.01) |
| *G11C 29/52* | (2006.01) |
| *G06F 11/10* | (2006.01) |
| *H03M 13/19* | (2006.01) |
| *G11C 29/04* | (2006.01) |

(52) U.S. Cl.
CPC ........ *G06F 3/0679* (2013.01); *G06F 11/1048* (2013.01); *G11C 29/52* (2013.01); *H03M 13/19* (2013.01); *G11C 2029/0411* (2013.01)

(58) Field of Classification Search
CPC ...... G06F 3/0679; G06F 11/1068; G06F 3/06; G06F 3/0619; G06F 3/064; G11C 29/52; H03M 13/11; H03M 13/15; H03M 13/1575; H03M 13/27; H04L 1/00; A61B 5/00; A61N 1/36; A61N 1/365; C12Q 1/68
See application file for complete search history.

(56) References Cited

U.S. PATENT DOCUMENTS

| | | | |
|---|---|---|---|
| 6,675,349 B1* | 1/2004 | Chen | H03M 13/11 714/758 |
| 2012/0110417 A1* | 5/2012 | D'Abreu | G06F 11/1012 714/773 |
| 2014/0245105 A1* | 8/2014 | Chung | G06F 11/1048 714/763 |
| 2017/0293523 A1* | 10/2017 | Lunadier | G06F 3/0619 |

* cited by examiner

*Primary Examiner* — Albert Decady
*Assistant Examiner* — Enamul M Kabir
(74) *Attorney, Agent, or Firm* — William Park & Associates Ltd.

(57) ABSTRACT

A semiconductor device may include a data storage region, a parity storage region and an error correction circuit. The data storage region may be configured to store first data and second data. The parity storage region may be configured to store a parity. The error correction circuit may be configured to correct an error of the first data or an error of the second data and the parity, based on a transmission selection signal.

19 Claims, 9 Drawing Sheets

SEMICONDUCTOR DEVICES

CROSS-REFERENCE TO RELATED APPLICATIONS

The present application claims priority under 35 U.S.C. 119(a) to Korean Patent Application No. 10-2016-0061101, filed on May 18, 2016, which is incorporated herein by reference in its entirety.

BACKGROUND

1. Technical Field

Embodiments of the present disclosure may generally relate to semiconductor devices, and more particularly, to a semiconductor device configured to selectively correct data.

2. Related Art

Recently, a DDR2 scheme or a DDR3 scheme receiving and outputting four bit data or eight bit data during each clock cycle time has been used to improve an operation speed of semiconductor devices. If a data transmission speeds of the semiconductor devices increase, the probability of errors occurring may increase while the semiconductor devices are operating. Accordingly, novel design schemes have been proposed to improve the reliability of the data transmissions.

Whenever data is transmitted in semiconductor devices, error codes which are capable of detecting an occurrence of the errors may be generated and transmitted with the data to improve the reliability of the data transmission. The error codes may include an error detection code (EDC) which is capable of detecting errors and an error correction code (ECC) which is capable of correcting the errors by itself.

SUMMARY

According to an embodiment, a semiconductor device may be provided. The semiconductor device may include a data storage region, a parity storage region and an error correction circuit. The data storage region may be configured to store first data and second data. The parity storage region may be configured to store a parity. The error correction circuit may be configured to correct an error of the first data or an error of the second data and the parity, based on a transmission selection signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
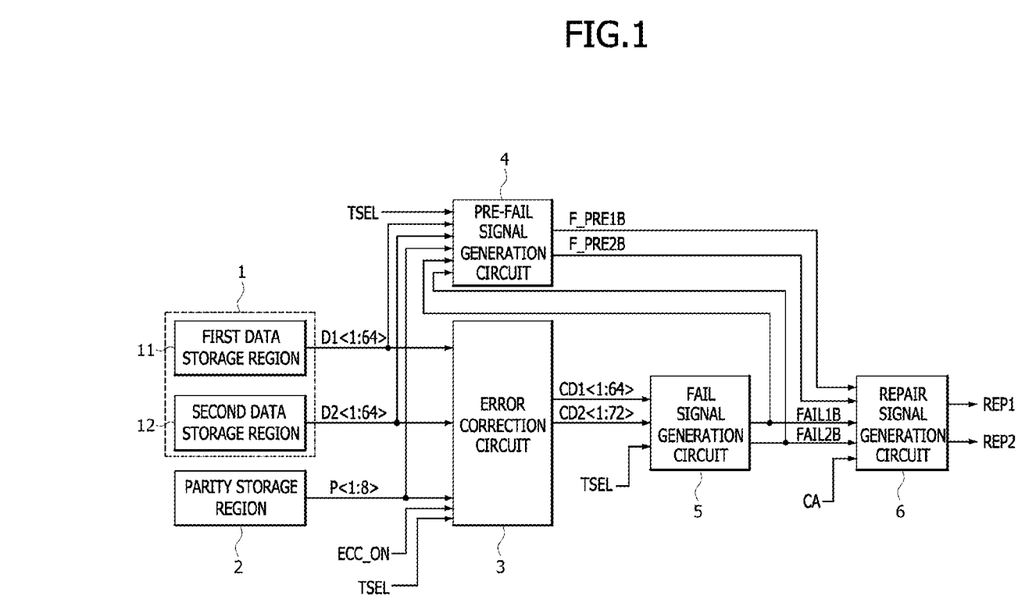
FIG. 1 is a block diagram illustrating a representation of an example of a configuration of a semiconductor device according to an embodiment.

Referring to FIG. 1, a semiconductor device according to an embodiment may include a data storage region 1, a parity storage region 2, an error correction circuit 3, a pre-fail signal generation circuit 4, a fail signal generation circuit 5 and a repair signal generation circuit 6.

The data storage region 1 may include a first data storage region 11 and a second data storage region 12. The first data storage region 11 may store first data D1<1:64>. The second data storage region 12 may store second data D2<1:64>. The number of bits included in each of the first and second data D1<1:64> and D2<1:64> may be set to be different according to the embodiments.

The parity storage region 2 may include a parity P<1:8> which is generated to correct errors included in the first and second data D1<1:64> and D2<1:64>. The parity storage region 2 may generate the parity P<1:8> from the first and second data D1<1:64> and D2<1:64> using, for example but not limited to, a hamming code realization scheme. The number of bit or bits included in the parity P<1:8> may be set to be different according to the embodiments.

The error correction circuit 3 may correct the first and second data D1<1:64> and D2<1:64> to generate first corrected data CD1<1:64> and second corrected data CD2<1:72> in response to a mode on signal ECC_ON, a transmission selection signal TSEL and the parity P<1:8>. A configuration and an operation of the error correction circuit 3 will be described below with reference to FIGS. 2 to 5.

The pre-fail signal generation circuit 4 may detect errors included in the first and second data D1<1:64> and D2<1:64> and the parity P<1:8> to generate a first pre-fail signal F_PRE1B and a second pre-fail signal F_PRE2B in response to the transmission selection signal TSEL, a first fail signal FAIL1B and a second fail signal FAIL2B. The pre-fail signal generation circuit 4 may generate the first and second pre-fail signals F_PRE1B and F_PRE2B which are enabled if errors are included in the first data D1<1:64>, the second data D2<1:64> or the parity P<1:8> while the transmission selection signal TSEL is enabled and the first and second fail signals FAIL1B and FAIL2B are disabled. That is, the pre-fail signal generation circuit 4 may generate the first and second pre-fail signals F_PRE1B and F_PRE2B which are enabled if errors included in the first and second data D1<1:64> and D2<1:64> and the parity P<1:8> are corrected by the error correction circuit 3 and no errors are included in the first and second corrected data CD1<1:64> and CD2<1:72>. Logic levels of the first and second pre-fail signals F_PRE1B and F_PRE2B, which are enabled, may be set to be different according to the embodiments. A configuration and an operation of the pre-fail signal generation circuit 4 will be described below with reference to FIG. 6.

The fail signal generation circuit 5 may detect errors included in the first and second corrected data CD1<1:64> and CD2<1:72> to generate the first and second fail signals FAIL1B and FAIL2B in response to the transmission selection signal TSEL. The fail signal generation circuit 5 may generate the first and second fail signals FAIL1B and FAIL2B which are disabled if the transmission selection signal TSEL is enabled and no errors are included in the first and second corrected data CD1<1:64> and CD2<1:72>. Logic levels of the first and second fail signals FAIL1B and FAIL2B, which are disabled, may be set to be different according to the embodiments. A configuration and an operation of the fail signal generation circuit 5 will be described below with reference to FIG. 7.

The repair signal generation circuit 6 may generate a first repair signal REP1 and a second repair signal REP2 in response to the first and second pre-fail signals F_PRE1B and F_PRE2B, the first and second fail signals FAIL1B and FAIL2B, and a control signal CA. The repair signal generation circuit 6 may generate the first and second repair signals REP1 and REP2, one of which is selectively enabled according to the control signal CA while the first and second pre-fail signals F_PRE1B and F_PRE2B and the first and second fail signals FAIL1B and FAIL2B have predetermined logic levels. The first data storage region 11 may be repaired if the first repair signal REP1 is enabled, and the second data storage region 12 may be repaired if the second repair signal REP2 is enabled. The control signal CA may include at least one of a command, a row address signal and a column address signal. A configuration and an operation of the repair signal generation circuit 6 will be described below with reference to FIG. 8.

Figure 2:
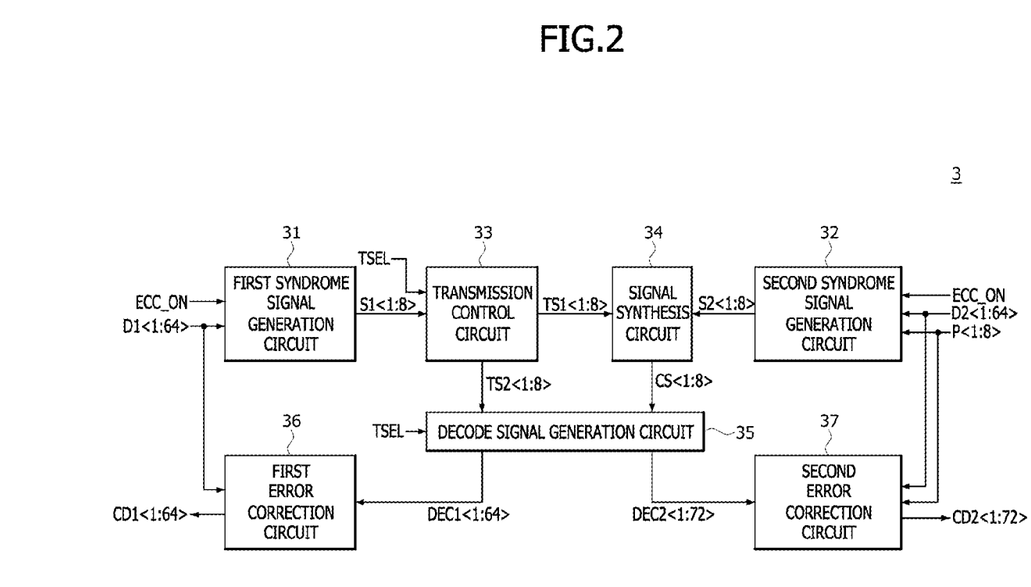
FIG. 2 is a block diagram illustrating a representation of an example of a configuration of an error correction circuit included in the semiconductor device of FIG. 1.

Referring to FIG. 2, the error correction circuit 3 may include a first syndrome signal generation circuit 31, a second syndrome signal generation circuit 32, a transmission control circuit 33, a signal synthesis circuit 34, a decode signal generation circuit 35, a first error correction circuit 36 and a second error correction circuit 37.

The first syndrome signal generation circuit 31 may generate a first syndrome signal S1<1:8> from the first data D1<1:64> in response to the mode on signal ECC_ON. The mode on signal ECC_ON may be enabled if a data correction operation executed according to an error correction code ECC starts. The first syndrome signal generation circuit 31 may generate the first syndrome signal S1<1:8> including information on errors of the first data D1<1:64> using, for example but not limited to, a hamming code realization scheme if the mode on signal ECC_ON is enabled. The first syndrome signal generation circuit 31 may generate the first syndrome signal S1<1:8> which is set to have a logic "low" level if the mode on signal ECC_ON is disabled. The first syndrome signal generation circuit 31 may generate the first syndrome signal S1<1:8> from the first data D1<1:64> regardless of the parity P<1:8>. This is because the first syndrome signal S1<1:8> is generated from the first data D1<1:64> having a predetermined pattern while all of bits included in the first and second data D1<1:64> and D2<1:64> have a logic "low" level and all of bits included in the parity P<1:8> are set to have a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The second syndrome signal generation circuit 32 may generate a second syndrome signal S2<1:8> from the second data D2<1:64> and the parity P<1:8> in response to the mode on signal ECC_ON. The second syndrome signal generation circuit 32 may generate the second syndrome signal S2<1:8> including information on errors of the second data D2<1:64> and the parity P<1:8> using, for example but not limited to, a hamming code realization scheme if the mode on signal ECC_ON is enabled. The second syndrome signal generation circuit 32 may generate the second syndrome signal S2<1:8> which is set to have a logic "low" level if the mode on signal ECC_ON is disabled. Further, the logic levels of the signals may be different from or the opposite of those described. For example, a signal described as having a logic "high" level may alternatively have a logic "low" level, and a signal described as having a logic "low" level may alternatively have a logic "high" level.

The transmission control circuit 33 may output the first syndrome signal S1<1:8> as a first transmission syndrome signal TS1<1:8> or a second transmission syndrome signal TS2<1:8> in response to the transmission selection signal TSEL. The transmission control circuit 33 may output the first syndrome signal S1<1:8> as the second transmission syndrome signal TS2<1:8> if the transmission selection signal TSEL is enabled. The transmission control circuit 33 may set the first transmission syndrome signal TS1<1:8> to a logic "low" level if the transmission selection signal TSEL is enabled. The transmission control circuit 33 may output the first syndrome signal S1<1:8> as the first transmission syndrome signal TS1<1:8> if the transmission selection signal TSEL is disabled. The transmission control circuit 33 may set the second transmission syndrome signal TS2<1:8> to a logic "low" level if the transmission selection signal TSEL is disabled. A configuration and an operation of the transmission control circuit 33 will be described below with reference to FIG. 3. Further, the logic levels of the signals may be different from or the opposite of those described. For example, a signal described as having a logic "high" level may alternatively have a logic "low" level, and a signal described as having a logic "low" level may alternatively have a logic "high" level.

The signal synthesis circuit 34 may synthesize the first transmission syndrome signal TS1<1:8> and the second syndrome signal S2<1:8> to generate a synthesized syndrome signal CS<1:8>. The signal synthesis circuit 34 may execute a logic operation, for example but not limited to, an exclusive OR operation of the first transmission syndrome signal TS1<1:8> and the second syndrome signal S2<1:8> to generate the synthesized syndrome signal CS<1:8>.

The decode signal generation circuit 35 may generate a first decode signal DEC1<1:64> and a second decode signal DEC2<1:72> from the second transmission syndrome signal TS2<1:8> and the synthesized syndrome signal CS<1:8> in response to the transmission selection signal TSEL. The first decode signal DEC1<1:64> may include information on errors included in the first data D1<1:64>. For example, if only a third bit DEC1<3> of the first decode signal DEC1<1:64> has a logic "high" level, a third bit D1<3> of the first data D1<1:64> corresponding to the third bit DEC1<3> of the first decode signal DEC1<1:64> may be regarded as an erroneous bit. A correspondence relationship between the bits of the first data D1<1:64> and the bits of the first decode signal DEC1<1:64> may be set to be different according to the embodiments. The second decode signal DEC2<1:72> may include information on errors included in the second data D2<1:64> and the parity P<1:8>. For example, if only a fifth bit DEC2<5> of the second decode signal DEC2<1: 72> has a logic "high" level, a fifth bit D2<5> of the second data D2<1:64> corresponding to the fifth bit DEC2<5> of the second decode signal DEC2<1:72> may be regarded as an erroneous bit. In addition, if only a sixty fifth bit DEC2<65> of the second decode signal DEC2<1:72> has a logic "high" level, a first bit P<1> of the parity P<1:8> corresponding to the sixty fifth bit DEC2<65> of the second decode signal DEC2<1:72> may be regarded as an erroneous bit. A correspondence relationship between the bits of the second decode signal DEC2<1:72> and the bits of the second data D2<1:64> and the parity P<1:8> may be set to be different according to the embodiments. The decode signal generation circuit 35 may generate the first decode signal DEC1<1:64> from the information on errors of the first data D1<1:64> included in the second transmission syndrome signal TS2<1:8> if the transmission selection signal TSEL is enabled. The decode signal generation circuit 35 may generate the second decode signal DEC2<1:72> from the information on errors of the second data D2<1:64> and the parity P<1:8> included in the synthesized syndrome signal CS<1:8> if the transmission selection signal TSEL is enabled. The decode signal generation circuit 35 may generate the first decode signal DEC1<1:64> from the information on errors of the first data D1<1:64> included in the synthesized syndrome signal CS<1:8> if the transmission selection signal TSEL is disabled. The decode signal generation circuit 35 may generate the second decode signal DEC2<1:72> from the information on errors of the second data D2<1:64> and the parity P<1:8> included in the synthesized syndrome signal CS<1:8> if the transmission selection signal TSEL is disabled. A configuration and an operation of the decode signal generation circuit 35 will be described below with reference to FIGS. 4 and 5.

The first error correction circuit 36 may correct errors included in the first data D1<1:64> to generate the first corrected data CD1<1:64> in response to the first decode signal DEC1<1:64>. For example, the first error correction circuit 36 may invert a level of a third bit D1<3> of the first data D1<1:64> to output the first data D1<1:64> including the inverted third bit as the first corrected data CD1<1:64> if only a third bit DEC1<3> among the bits of the first decode signal DEC1<1:64> has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The second error correction circuit 37 may correct errors included in the second data D2<1:64> and the parity P<1:8> to generate the second corrected data CD2<1:72> in response to the second decode signal DEC1<1:72>. For example, the second error correction circuit 37 may invert a level of a fifth bit D2<5> of the second data D2<1:64> to output the second data D2<1:64> including the inverted fifth bit and the parity P<1:8> as the second corrected data CD2<1:72> if only a fifth bit DEC2<5> among the bits of the second decode signal DEC2<1:72> has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

Figure 3:
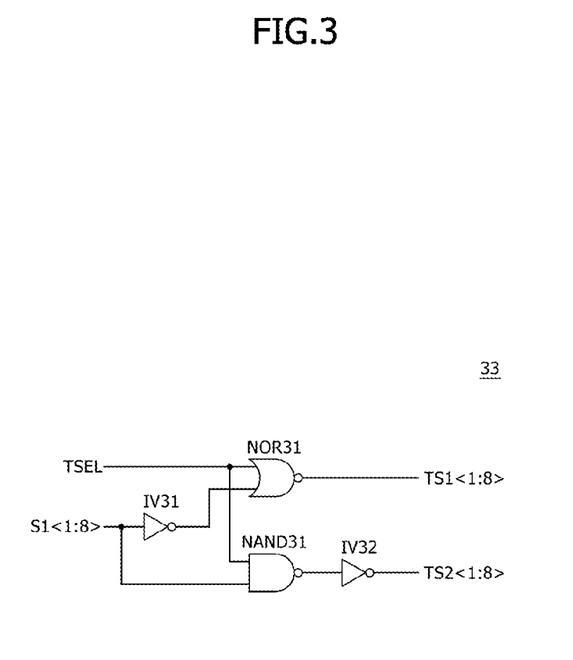
FIG. 3 is a circuit diagram illustrating a representation of an example of a transmission control circuit included in the error correction circuit of FIG. 2.

Referring to FIG. 3, the transmission control circuit 33 may include inverters IV31 and IV32, and logic gates, for example but not limited to, a NOR gate NOR31 and a NAND gate NAND31. The transmission control circuit 33 may output the first syndrome signal S1<1:8> as the second transmission syndrome signal TS2<1:8> if the transmission selection signal TSEL is enabled to have a logic "high" level. The transmission control circuit 33 may set the first transmission syndrome signal TS1<1:8> to a logic "low" level if the transmission selection signal TSEL is enabled to have a logic "high" level. The transmission control circuit 33 may output the first syndrome signal S1<1:8> as the first transmission syndrome signal TS1<1:8> if the transmission selection signal TSEL is disabled to have a logic "low" level. The transmission control circuit 33 may set the second transmission syndrome signal TS2<1:8> to a logic "low" level if the transmission selection signal TSEL is disabled to have a logic "low" level. In such a case, the second transmission syndrome signal TS2<1:8> does not affect the synthesized syndrome signal CS<1:8> generated from the signal synthesis circuit 34 because the second transmission syndrome signal TS2<1:8> is set to have a logic "low" level.

Figure 4:
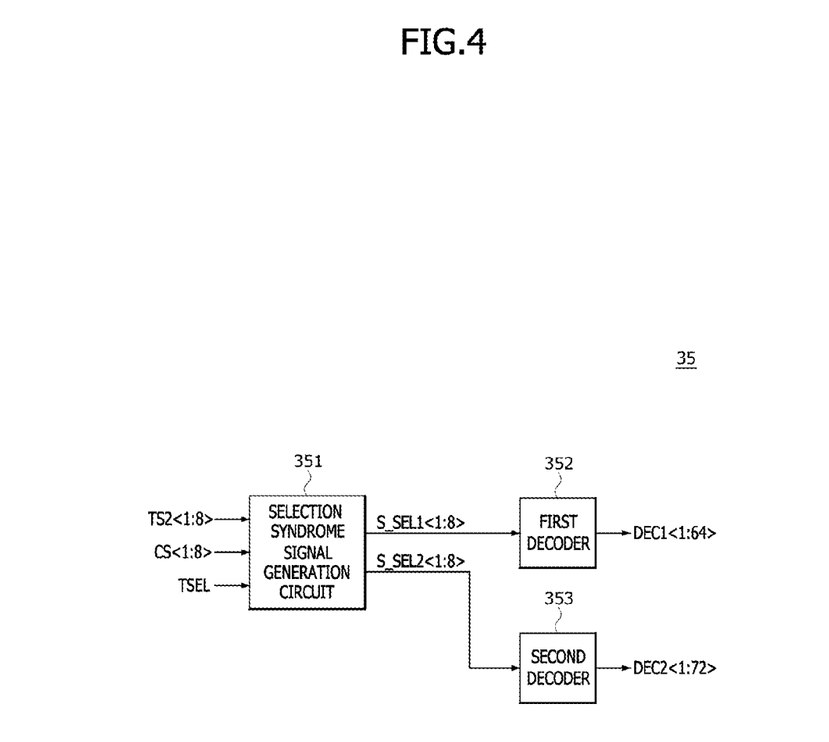
FIG. 4 is a block diagram illustrating a representation of an example of a configuration of a decode signal generation circuit included in the error correction circuit of FIG. 2.

Referring to FIG. 4, the decode signal generation circuit 35 may include a selection syndrome signal generation circuit 351, a first decoder 352 and a second decoder 353.

The selection syndrome signal generation circuit 351 may generate a first selection syndrome signal S_SEL1<1:8> and a second selection syndrome signal S_SEL2<1:8> from the second transmission syndrome signal TS2<1:8> or the synthesized syndrome signal CS<1:8> in response to the transmission selection signal TSEL. The selection syndrome signal generation circuit 351 may buffer the second transmission syndrome signal TS2<1:8> to generate the first selection syndrome signal S_SEL1<1:8> if the transmission selection signal TSEL has a logic "high" level. The selection syndrome signal generation circuit 351 may buffer the synthesized syndrome signal CS<1:8> to generate the first selection syndrome signal S_SEL1<1:8> if the transmission selection signal TSEL has a logic "low" level. The selection syndrome signal generation circuit 351 may buffer the synthesized syndrome signal CS<1:8> to generate the second selection syndrome signal S_SEL2<1:8>.

The first decoder 352 may decode the first selection syndrome signal S_SEL1<1:8> to generate the first decode signal DEC1<1:64>. The first decode signal DEC1<1:64> may include information on errors included in the first data D1<1:64>. For example, if only a third bit DEC1<3> of the first decode signal DEC1<1:64> has a logic "high" level, a third bit D1<3> of the first data D1<1:64> corresponding to the third bit DEC1<3> of the first decode signal DEC1<1: 64> may be regarded as an erroneous bit. A correspondence relationship between the bits of the first data D1<1:64> and the bits of the first decode signal DEC1<1:64> may be set to be different according to the embodiments.

The second decoder 353 may decode the second selection syndrome signal S_SEL2<1:8> to generate the second decode signal DEC2<1:72>. The second decode signal DEC2<1:72> may include information on errors included in the second data D2<1:64> and the parity P<1:8>. For example, if only a fifth bit DEC2<5> of the second decode signal DEC2<1:72> has a logic "high" level, a fifth bit D2<5> of the second data D2<1:64> corresponding to the fifth bit DEC2<5> of the second decode signal DEC2<1:72> may be regarded as an erroneous bit. In addition, if only a sixty fifth bit DEC2<65> of the second decode signal DEC2<1:72> has a logic "high" level, a first bit P<1> of the parity P<1:8> corresponding to the sixty fifth bit DEC2<65> of the second decode signal DEC2<1:72> may be regarded as an erroneous bit. A correspondence relationship between the bits of the second decode signal DEC2<1:72> and the bits of the second data D2<1:64> and the parity P<1:8> may be set to be different according to the embodiments.

Figure 5:
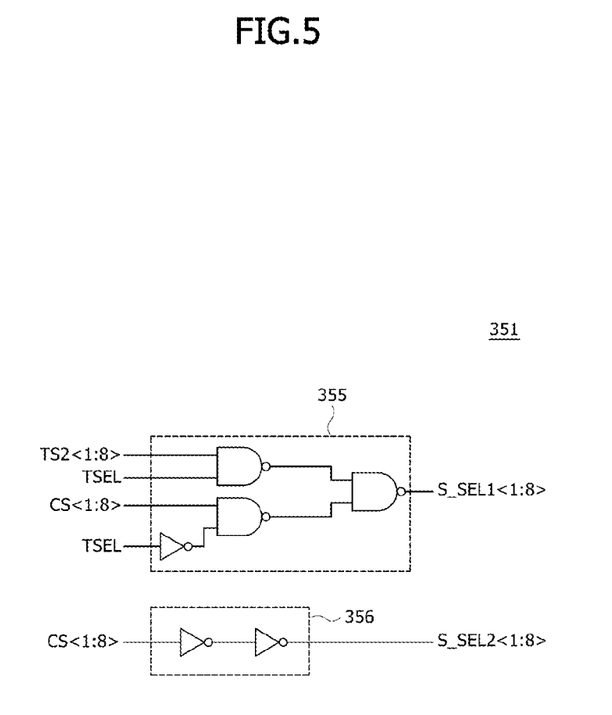
FIG. 5 is a circuit diagram illustrating a representation of an example of a selection syndrome signal generation circuit included in the decode signal generation circuit of FIG. 4.

Referring to FIG. 5, the selection syndrome signal generation circuit 351 may include a first selection syndrome signal generation circuit 355 and a second selection syndrome signal generation circuit 356. The first selection syndrome signal generation circuit 355 may buffer the second transmission syndrome signal TS2<1:8> to generate the first selection syndrome signal S_SEL1<1:8> if the transmission selection signal TSEL has a logic "high" level. The first selection syndrome signal generation circuit 355 may buffer the synthesized syndrome signal CS<1:8> to generate the first selection syndrome signal S_SEL1<1:8> if the transmission selection signal TSEL has a logic "low" level. The second selection syndrome signal generation circuit 356 may buffer the synthesized syndrome signal CS<1:8> to generate the second selection syndrome signal S_SEL2<1:8>.

Figure 6:
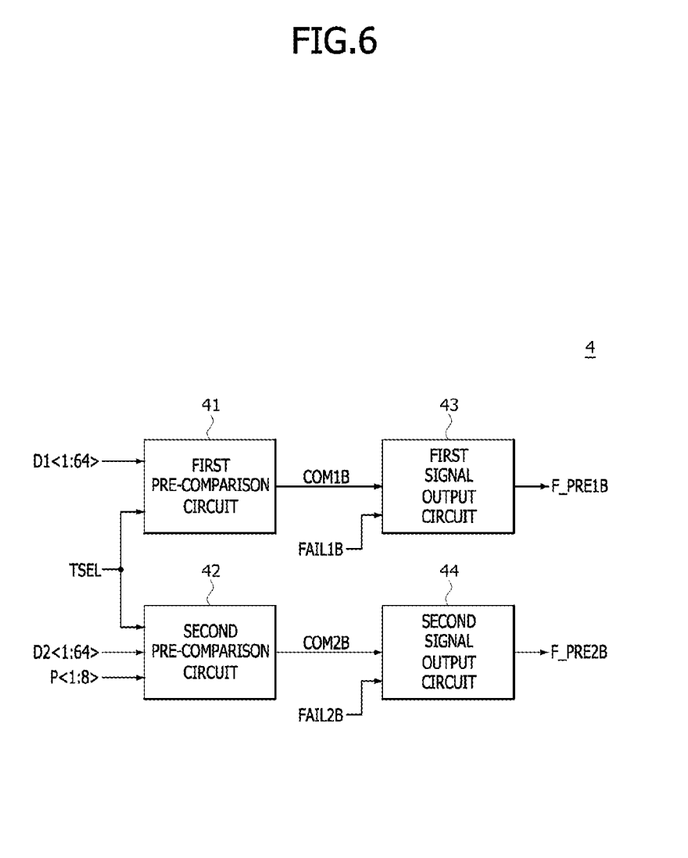
FIG. 6 is a block diagram illustrating a representation of an example of a configuration of a pre-fail signal generation circuit included in the semiconductor device of FIG. 1.

Referring to FIG. 6, the pre-fail signal generation circuit 4 may include a first pre-comparison circuit 41, a second pre-comparison circuit 42, a first signal output circuit 43 and a second signal output circuit 44.

The first pre-comparison circuit 41 may generate a first comparison signal COM1B from the first data D1<1:64> in response to the transmission selection signal TSEL. The first pre-comparison circuit 41 may compare logic levels of the bits included in the first data D1<1:64> with each other to generate the first comparison signal COM1B while the transmission selection signal TSEL is enabled to have a logic "high" level. If the first data D1<1:64> include at least one erroneous bit, the first pre-comparison circuit 41 may generate the first comparison signal COM1B which is enabled to have a logic "low" level because all of the bits included in the first data D1<1:64> do not have the same logic level. The first pre-comparison circuit 41 may include a compressive parallel test circuit to write data having the same logic level into all of the bits included in the first data D1<1:64> and to execute a compressive parallel test for reading out the first data D1<1:64>. Further, the logic levels of the signals may be different from or the opposite of those described. For example, a signal described as having a logic "high" level may alternatively have a logic "low" level, and a signal described as having a logic "low" level may alternatively have a logic "high" level.

The second pre-comparison circuit 42 may generate a second comparison signal COM2B from the second data D2<1:64> and the parity P<1:8> in response to the transmission selection signal TSEL. The second pre-comparison circuit 42 may compare logic levels of the bits included in the second data D2<1:64> and the parity P<1:8> with each other to generate the second comparison signal COM2B while the transmission selection signal TSEL is enabled to have a logic "high" level. If the second data D2<1:64> or the parity P<1:8> include at least one erroneous bit, the second pre-comparison circuit 42 may generate the second comparison signal COM2B which is enabled to have a logic "low" level because all of the bits included in the second data D2<1:64> and the parity P<1:8> do not have the same logic level. The second pre-comparison circuit 42 may include a compressive parallel test circuit to write data having the same logic level into all of the bits included in the second data D2<1:64> and the parity P<1:8> and to execute a compressive parallel test for reading out the second data D2<1:64> and the parity P<1:8>. Further, the logic levels of the signals may be different from or the opposite of those described. For example, a signal described as having a logic "high" level may alternatively have a logic "low" level, and a signal described as having a logic "low" level may alternatively have a logic "high" level.

The first signal output circuit 43 may output the first pre-fail signal F_PRE1B in response to the first comparison signal COM1B and the first fail signal FAIL1B. The first signal output circuit 43 may generate the first pre-fail signal F_PRE1B which is enabled if the first comparison signal COM1B is enabled and the first fail signal FAIL1B is disabled. The first signal output circuit 43 may generate the first pre-fail signal F_PRE1B which is enabled if the errors included in the first data D1<1:64> are corrected so that no errors are included in the first corrected data CD1<1:64>.

The second signal output circuit 44 may output the second pre-fail signal F_PRE2B in response to the second comparison signal COM2B and the second fail signal FAIL2B. The second signal output circuit 44 may generate the second pre-fail signal F_PRE2B which is enabled if the second comparison signal COM2B is enabled and the second fail signal FAIL2B is disabled. The second signal output circuit 44 may generate the second pre-fail signal F_PRE2B which is enabled if the errors included in the second data D2<1:64> and the parity P<1:8> are corrected so that no errors are included in the second corrected data CD2<1:72>.

If the errors included in the first and second data D1<1:64> and D2<1:64> and the parity P<1:8> are corrected so that no errors are included in the first and second corrected data CD1<1:64> and CD2<1:72>, the pre-fail signal generation circuit 4 may generate the first and second pre-fail signals F_PRE1B and F_PRE2B which are enabled.

Figure 7:
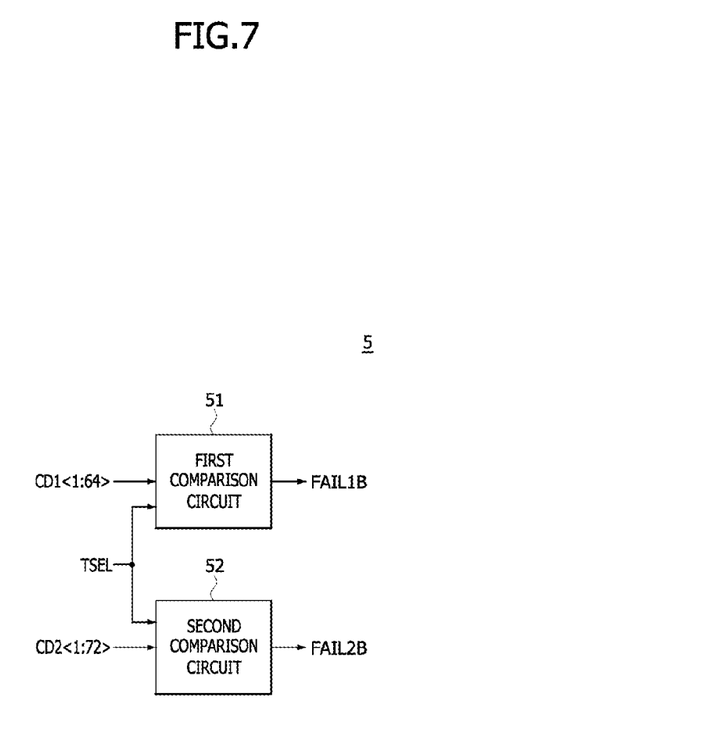
FIG. 7 is a block diagram illustrating a representation of an example of a configuration of a fail signal generation circuit included in the semiconductor device of FIG. 1.

Referring to FIG. 7, the fail signal generation circuit 5 may include a first comparison circuit 51 and a second comparison circuit 52. The first comparison circuit 51 may generate the first fail signal FAIL1B from the first corrected data CD1<1:64> in response to the transmission selection signal TSEL. The first comparison circuit 51 may compare logic levels of the bits included in the first corrected data CD1<1:64> with each other to generate the first fail signal FAIL1B while the transmission selection signal TSEL is enabled to have a logic "high" level. The first comparison circuit 51 may include, for example but not limited to, a compressive parallel test circuit to write data having the same logic level into all of the bits included in the first corrected data CD1<1:64> and to execute a compressive parallel test for reading out the first corrected data CD1<1:64>. The second comparison circuit 52 may generate the second fail signal FAIL2B from the second corrected data CD2<1:72> in response to the transmission selection signal TSEL. The second comparison circuit 52 may compare logic levels of the bits included in the second corrected data CD1<1:72> with each other to generate the second fail signal FAIL2B while the transmission selection signal TSEL is enabled to have a logic "high" level. The second comparison circuit 52 may include a compressive parallel test circuit to write data having the same logic level into all of the bits included in the second corrected data CD2<1:72> and to execute a compressive parallel test for reading out the second corrected data CD2<1:72>. Further, the logic levels of the signals may be different from or the opposite of those described. For example, a signal described as having a logic "high" level may alternatively have a logic "low" level, and a signal described as having a logic "low" level may alternatively have a logic "high" level.

Figure 8:
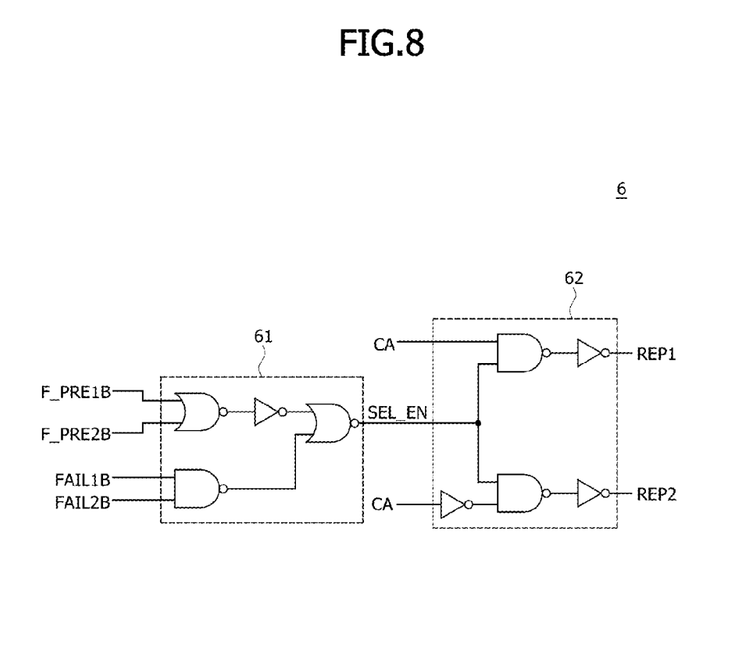
FIG. 8 is a block diagram illustrating a representation of an example of a configuration of a repair signal generation circuit included in the semiconductor device of FIG. 1.

Referring to FIG. 8, the repair signal generation circuit 6 may include a selection activation signal generation circuit 61 and a signal output circuit 62.

The selection activation signal generation circuit 61 may generate a selection activation signal SEL_EN which is enabled while the first and second pre-fail signals F_PRE1B and F_PRE2B and the first and second fail signals FAIL1B and FAIL2B have a predetermined level combination. The predetermined level combination of the first and second pre-fail signals F_PRE1B and F_PRE2B and the first and second fail signals FAIL1B and FAIL2B for enabling the selection activation signal SEL_EN may be set to be different according to the embodiments.

The signal output circuit 62 may generate the first repair signal REP1 and the second repair signal REP2, one of which is selectively enabled according to the control signal CA while the selection activation signal SEL_EN is enabled. A logic level of the control signal CA for enabling the first repair signal REP1 or the second repair signal REP2 may be set to different according to the embodiments.

An operation of the semiconductor device having an aforementioned configuration will be described hereinafter in conjunction with an example in which the transmission selection signal TSEL is disabled and an example in which the transmission selection signal TSEL is enabled. Further, the logic levels of the signals may be different from or the opposite of those described. For example, a signal described as having a logic "high" level may alternatively have a logic "low" level, and a signal described as having a logic "low" level may alternatively have a logic "high" level.

If the transmission selection signal TSEL is disabled to have a logic "low" level, the first syndrome signal S1<1:8> may be outputted as the first transmission syndrome signal TS1<1:8> and an exclusive OR operation of the first transmission syndrome signal TS1<1:8> and the second syndrome signal S2<1:8> may be executed to generate the synthesized syndrome signal CS<1:8>. In such a case, all of the bits included in the first transmission syndrome signal TS1<1:8> or all of the bits included in the second syndrome signal S2<1:8> may be set to have a logic "low" level. If all of the bits included in the first transmission syndrome signal TS1<1:8> are set to have a logic "low" level, the synthesized syndrome signal CS<1:8> may be generated by buffering the second syndrome signal S2<1:8> including the information on the errors included in the second data D2<1:64> and the parity P<1:8>. Thus, errors included in the second data D2<1:64> and the parity P<1:8> may be corrected by the second decode signal DEC2<1:72> which is generated by decoding the synthesized syndrome signal CS<1:8>, and the corrected second data D2<1:64> and the corrected parity P<1:8> may produce the second corrected data CD2<1:72>. If all of the bits included in the second syndrome signal S2<1:8> are set to have a logic "low" level, the synthesized syndrome signal CS<1:8> may be generated by buffering the first transmission syndrome signal TS1<1:8> including the information on the errors included in the first data D1<1:64>. Accordingly, errors included in the first data D1<1:64> may be corrected by the first decode signal DEC1<1:64> which is generated by decoding the synthesized syndrome signal CS<1:8>, and the corrected first data D1<1:64> may produce the first corrected data CD1<1:64>.

If the transmission selection signal TSEL is enabled to have a logic "high", the first syndrome signal S1<1:8> may be outputted as the second transmission syndrome signal TS2<1:8> and all of the bits included in the first transmission syndrome signal TS1<1:8> may be set to have a logic "low" level. Thus, the second syndrome signal S2<1:8> may be buffered to generate the synthesized syndrome signal CS<1:8>. Errors included in the first data D1<1:64> may be corrected by the first decode signal DEC2<1:64> which is generated by decoding the second transmission syndrome signal TS2<1:8>, and the corrected first data D1<1:64> may produce the first corrected data CD1<1:64>. Errors included in the second data D2<1:64> and the parity P<1:8> may be corrected by the second decode signal DEC2<1:72> which is generated by decoding the synthesized syndrome signal CS<1:8>, and the corrected second data D2<1:64> and the corrected parity P<1:8> may produce the second corrected data CD1<1:72>.

If one erroneous bit is included in each of the first data D1<1:64> and the second data D2<1:64> and the first and second corrected data CD1<1:64> and CD2<1:72> are generated, the first data storage region 11 may be repaired or the second data storage region 12 and the parity storage region 2 may be repaired according to a logic level of the control signal CA.

As described above, a semiconductor device according to an embodiment may selectively correct errors included in the first data D1<1:64> or the second data D2<1:64> and the parity P<1:8>. In addition, the semiconductor device selectively repair any one of the first data storage region 11, the second data storage region 12 and the parity storage region 2.

Figure 9:
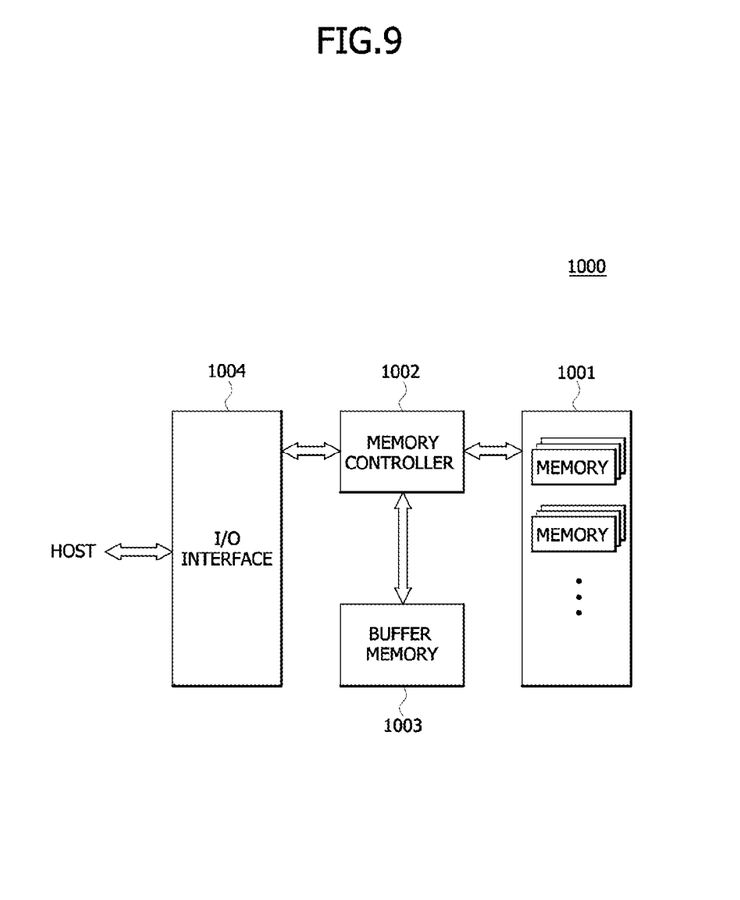
FIG. 9 is a block diagram illustrating a representation of an example of a configuration of an electronic system employing the semiconductor device illustrated in FIGS. 1 to 8.

The semiconductor device described with reference to FIGS. 1 to 8 may be applied to an electronic system that includes, for example but not limited to, a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the present disclosure, data stored in any one of a plurality of data storage regions may be selectively corrected to improve an efficiency of correcting the data.

In addition, any one of the plurality of data storage regions may be selectively repaired to improve a repair efficiency of a semiconductor device.

What is claimed is:

1. A semiconductor device comprising:
   a data storage region configured to store first data and second data;
   a parity storage region configured to store a parity; and
   an error correction circuit configured to correct an error of the first data and an error of the second data and the parity, combined together, when a transmission selection signal is disabled, and configured to correct the error of the first data, separate from the error of the second data and the parity, when the transmission selection signal is enabled, wherein the error correction circuit includes a first syndrome signal generation circuit configured to generate a first syndrome signal from the first data, a second syndrome signal generation circuit configured to generate a second syndrome signal from the second data and the parity, a transmission control circuit configured to output the first syndrome signal as a first transmission syndrome signal or a second transmission syndrome signal based on the transmission selection signal, a signal synthesis circuit configured to generate a synthesized syndrome signal from the first transmission syndrome signal and the second syndrome signal, and a decode signal generation circuit configured to decode the second transmission syndrome signal and the synthesized syndrome signal to generate a first decode signal and a second decode signal based on the transmission selection signal.

2. The semiconductor device of claim 1, wherein the first syndrome signal generation circuit is configured to generate the first syndrome signal including information on the error included in the first data using a hamming code realization scheme.

3. The semiconductor device of claim 1, wherein the second syndrome signal generation circuit is configured to generate the second syndrome signal including information on the error included in the second data and the parity using a hamming code realization scheme.

4. The semiconductor device of claim 1, wherein the transmission control circuit is configured to output the first syndrome signal as the second transmission syndrome signal based on the transmission selection signal.

5. The semiconductor device of claim 1, wherein the transmission control circuit is configured to output the first syndrome signal as the first transmission syndrome signal based on the transmission selection signal.

6. The semiconductor device of claim 1, wherein the decode signal generation circuit is configured to decode the second transmission syndrome signal to generate the first decode signal and configured to decode the synthesized syndrome signal to generate the second decode signal, based on the transmission selection signal.

7. The semiconductor device of claim 1, wherein the decode signal generation circuit is configured to decode the synthesized syndrome signal to generate the first decode signal and the second decode signal, based on the transmission selection signal.

8. The semiconductor device of claim 1, further comprising a first error correction circuit configured to correct the error included in the first data to generate the first corrected data based on the first decode signal.

9. The semiconductor device of claim 8, further comprising a second error correction circuit configured to correct the error included in the second data and the parity to generate the second corrected data based on the second decode signal.

10. A semiconductor device comprising:
    an error correction circuit configured to correct an error of a first data and an error of a second data and a parity, combined together, to generate a first corrected data and a second corrected data or configured to separately correct the error of the first data and the error of the second data and the parity to generate the first corrected data and the second corrected data, in response to a transmission selection signal;
    a fail signal generation circuit configured to generate a first fail signal and a second fail signal from the first corrected data and the second corrected data;
    a pre-fail signal generation circuit configured to generate a first pre-fail signal and a second pre-fail signal from the first and second data and the parity in response to the transmission selection signal and the first and second fail signals; and
    a repair signal generation circuit configured to generate a first repair signal and a second repair signal in response to the first and second pre-fail signals, the first and second fail signals, and a control signal, wherein the first repair signal is enabled to repair a storage region stored the first data.

11. The semiconductor device of claim 10, wherein the pre-fail signal generation circuit is configured to generate the first pre-fail signal and the second pre-fail signal which are enabled if the errors included in the first and second data and the parity are corrected so that the first and second fail signals are disabled, while the transmission selection signal is enabled.

12. The semiconductor device of claim 10,
wherein the fail signal generation circuit is configured to generate the first fail signal which is enabled if the first corrected data includes an error; and
wherein the fail signal generation circuit is configured to generate the second fail signal which is enabled if the second corrected data includes an error.

13. The semiconductor device of claim 10, wherein the repair signal generation circuit is configured to generate the first repair signal and the second repair signal, one of which is selectively enabled based on the control signal while the first and second pre-fail signals are enabled and the first and second fail signals are disabled.

14. The semiconductor device of claim 10, wherein the control signal includes at least one of a command, a row address and a column address.

15. The semiconductor device of claim 10, wherein the error correction circuit includes:
a first syndrome signal generation circuit configured to generate a first syndrome signal from the first data;
a second syndrome signal generation circuit configured to generate a second syndrome signal from the second data and the parity;
a transmission control circuit configured to output the first syndrome signal as a first transmission syndrome signal or a second transmission syndrome signal based on the transmission selection signal;
a signal synthesis circuit configured to generate a synthesized syndrome signal from the first transmission syndrome signal and the second syndrome signal; and
a decode signal generation circuit configured to decode the second transmission syndrome signal and the synthesized syndrome signal to generate a first decode signal and a second decode signal based on the transmission selection signal.

16. The semiconductor device of claim 15,
wherein the transmission control circuit is configured to output the first syndrome signal as the second transmission syndrome signal based on the transmission selection signal; and
wherein the transmission control circuit is configured to output the first syndrome signal as the first transmission syndrome signal based on the transmission selection signal.

17. The semiconductor device of claim 15, wherein the decode signal generation circuit is configured to decode the second transmission syndrome signal to generate the first decode signal and configured to decode the synthesized syndrome signal to generate the second decode signal, based on the transmission selection signal.

18. The semiconductor device of claim 15, wherein the decode signal generation circuit is configured to decode the synthesized syndrome signal to generate the first decode signal and the second decode signal, based on the transmission selection signal.

19. The semiconductor device of claim 15, further comprising:
a first error correction circuit configured to correct the error included in the first data to generate the first corrected data based on the first decode signal; and
a second error correction circuit configured to correct the error included in the second data and the parity to generate the second corrected data based on the second decode signal.

* * * * *